(12) United States Patent
Guo

(10) Patent No.: US 9,899,433 B2
(45) Date of Patent: Feb. 20, 2018

(54) ARRAY SUBSTRATE AND METHOD FOR PREPARING THE SAME, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Jian Guo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/492,709

(22) Filed: Sep. 22, 2014

(65) Prior Publication Data
US 2015/0279875 A1 Oct. 1, 2015

(30) Foreign Application Priority Data
Apr. 1, 2014 (CN) .......................... 2014 1 0129048

(51) Int. Cl.
*H01L 27/12* (2006.01)
(52) U.S. Cl.
CPC ........ *H01L 27/1288* (2013.01); *H01L 27/124* (2013.01)
(58) Field of Classification Search
None
See application file for complete search history.

(56) References Cited

U.S. PATENT DOCUMENTS 5,077,083 A * 12/1991 Lutz .................. C08G 59/24
427/331
2001/0053438 A1* 12/2001 Nishida .................. G02B 1/111
428/212

(Continued)

FOREIGN PATENT DOCUMENTS

CN 1411322 A 4/2003
CN 102651339 A 8/2012

OTHER PUBLICATIONS

First Office Action regarding Chinese application No. 201410129048.2, dated Feb. 26, 2016. Translation provided by Dragon Intellectual Property Law Firm.

*Primary Examiner* — Jay C Chang
(74) *Attorney, Agent, or Firm* — Harness, Dickey & Pierce, P.L.C.

(57) ABSTRACT

The invention relates to an array substrate and a method for preparing the same, and a display device. The method for preparing an array substrate comprises steps S1) forming a pattern, which includes a gate electrode, a gate electrode insulating layer, an active layer and a source-drain electrode, on a base substrate; and S2) forming a transparent conducting layer on the base substrate on which step S1 has been accomplished, and simultaneously forming a pattern including a pixel electrode and a data line via a one-time patterning process. In this method, the steps of the manufacture process can be reduced, the production cost can be saved, and the production efficiency can be improved. Moreover, since the pixel electrode and the data line may be both formed to have a low resistance value and a high light transmission rate, the performance of the array substrate can be improved.

14 Claims, 2 Drawing Sheets

(56) References Cited

U.S. PATENT DOCUMENTS

| | | | |
|---|---|---|---|
| 2006/0267202 A1* | 11/2006 | Matsuzaki | H01L 27/124 257/758 |
| 2008/0197348 A1* | 8/2008 | Matsubara | H01L 27/283 257/40 |
| 2009/0212290 A1* | 8/2009 | Youn | H01L 27/124 257/59 |
| 2013/0100390 A1 | 4/2013 | Wang | |
| 2013/0153911 A1 | 6/2013 | Zhang et al. | |
| 2014/0145178 A1* | 5/2014 | Lee | H01L 29/66969 257/43 |

* cited by examiner

ARRAY SUBSTRATE AND METHOD FOR PREPARING THE SAME, AND DISPLAY DEVICE

CROSS REFERENCE OF THE RELATED APPLICATION

The present application claims priority to the Chinese application No. 201410129048.2 filed on Apr. 1, 2014, entitled with "Array Substrate and Method for Preparing the same, and Display Device", the entire contents of which are incorporated herein by reference.

FIELD OF THE INVENTION

The present invention relates to the field of display technologies, and in particular, to an array substrate and a method for preparing the same, and a display device.

DESCRIPTION OF THE PRIOR ART

The manufacture process of the array substrate of a thin film transistor-liquid crystal display includes forming a gate electrode and a gate line, a gate electrode insulating layer, a gate electrode insulating layer via hole, an active layer, a source-drain electrode layer and a data line, as well as a pixel electrode, etc., on a base substrate. In the step of forming a pixel electrode, the pixel electrode layer is generally made of a material such as tin indium oxide (ITO) and zinc indium oxide (IZO), etc., which has a good transmittance but a large resistance value. While the data line layer is generally made of a metal such as molybdenum and aluminium, etc., which has a low resistance value but a poor light transmission rate. In order to guarantee the respective functions of the pixel electrode and the data line, the pixel electrode layer and the data line layer are manufactured with different masks in multiple steps to form the pixel electrode and the data line, thus the data line and the pixel electrode cannot be formed simultaneously. Therefore, the process steps in the manufacture process of the array substrate will be added, the production cost will be increased, and the production efficiency will be lowered.

In order to solve the above problems, beneficial improvements are made in the invention.

SUMMARY OF THE INVENTION

It is an object of the invention to provide a method for preparing an array substrate which can lower the production cost and improve the production efficiency.

It is a further object of the invention to provide an array substrate with excellent performances prepared by the method, and the pixel electrode and the data line can be both made to have a low resistance value and a high light transmission rate.

It is a still further object of the invention to provide an display device including the above array substrate.

The invention is realized via one or more of the following technical solutions.

According to an embodiment of the invention, the present invention provides a method for preparing an array substrate comprising:

Step S1: forming a pattern, which includes a gate electrode, a gate electrode insulating layer, an active layer, a source-drain electrode, on a base substrate; and Step S2: forming a transparent conducting layer on the base substrate on which step S1 has been accomplished, and simultaneously forming a pattern, which includes a pixel electrode and a data line, via a one-time patterning process.

According to another embodiment of the invention, in the step S1, the forming a gate electrode on the base substrate comprises forming a pattern of a gate line and gate line connecting wire.

According to another embodiment of the invention, the method further comprises:

Step S3: forming a passivation layer on the base substrate on which step S2 has been accomplished.

According to an embodiment of the invention, in the step S2, the transparent conducting layer is formed of a nano-silver material.

According to another embodiment of the invention, the step S2 comprises:

forming a transparent conducting layer and a planarization layer in turn on the base substrate on which step S1 has been accomplished, and simultaneously forming a pattern, which includes the pixel electrode and the data line, via a one-time patterning process.

According to another embodiment of the invention, the step S2 comprises:

forming a transparent conducting layer and a planarization layer in turn on the base substrate on which step S1 has been accomplished; and forming a photoresist layer on the planarization layer, exposing and developing the photoresist layer to form a photoresist reserved region and a photoresist removed region, wherein the photoresist reserved region corresponds to the pattern of the data line and the pixel electrode to be formed, and the rest is the photoresist removed region; and dry etching the planarization layer corresponding to the photoresist removed region to form a pattern corresponding to the pattern of the pixel electrode and the data line to be formed; and wet etching the transparent conducting layer under the etched planarization layer corresponding to the photoresist removed region to form a pattern that includes a data line and a pixel electrode, and then removing the photoresist on the photoresist reserved region.

According to another embodiment of the invention, the planarization layer is formed of an organic resin material.

According to another embodiment of the invention, the organic resin material is a non-photosensitive resin.

According to another embodiment of the invention, in the step S2, the transparent conducting layer is made of a graphene material.

According to another embodiment of the invention, the step S2 comprises:

forming a transparent conducting layer on the base substrate on which step S1 has been accomplished;

forming a photoresist layer on the transparent conducting layer, exposing and developing the photoresist layer to form a photoresist reserved region and a photoresist removed region, wherein the photoresist reserved region corresponds to the pattern of the data line and the pixel electrode to be formed, and the rest is the photoresist removed region; and dry etching the transparent electrode layer corresponding to the photoresist removed region to form a pattern that includes a pixel electrode and a data line, and then removing the photoresist on the photoresist reserved region.

According to another embodiment of the invention, the etching gas used for dry etching is one of $CF_6$ and $CF_4$, or a mixture thereof.

According to another embodiment of the invention, in the step S2, a pattern, which includes a pixel electrode and a data line, is formed on the base substrate on which step S1 has been accomplished, and a pattern of a protection layer for protecting the gate line connecting wire is also formed simultaneously.

According to an embodiment of the invention, the invention further provides an array substrate which is manufactured by the above method for preparing an array substrate, the array substrate comprises a base substrate; and a gate electrode, a gate electrode insulating layer, an active layer, a source-drain electrode, a pixel electrode and a data line are provided on the base substrate, wherein the pixel electrode and the data line are both formed of a nano-silver material, or both formed of a graphene material.

According to another embodiment of the invention, when both the pixel electrode and the data line are formed of a nano-silver material, a planarization layer corresponding to the pixel electrode and the data line is further provided on the pixel electrode and the data line.

According to another embodiment of the invention, the array substrate further comprises a gate line connecting wire on the same layer as the gate electrode.

According to another embodiment of the invention, a protection layer is provided on the gate line connecting wire, and the protection layer is formed of a nano-silver material or a graphene material.

According to an embodiment of the invention, the invention further provides a display device, which comprises the above array substrate.

In comparison with the prior art, the method for preparing an array substrate according to an embodiment of the invention or the array substrate prepared by the method has the following advantages:

1) In the array substrate according to the invention, a pixel electrode and a data line are formed simultaneously via a one-time patterning process, thus the steps of the manufacture process can be reduced, the production cost can be saved, and the production efficiency can be improved;

2) In the invention, by further employing a graphene or silver nano-wire material to manufacture a transparent conducting layer and to form a pixel electrode and a data line, the pixel electrode and the data line may be both made to have a low resistance value and a high light transmission rate, thereby the performance of the array substrate can be improved.

DETAILED DESCRIPTION OF THE PREFERRED EMBODIMENTS

Hereafter, the specific implementation of the present invention will be illustrated in detail in conjunction with the drawings.

Figure 4:
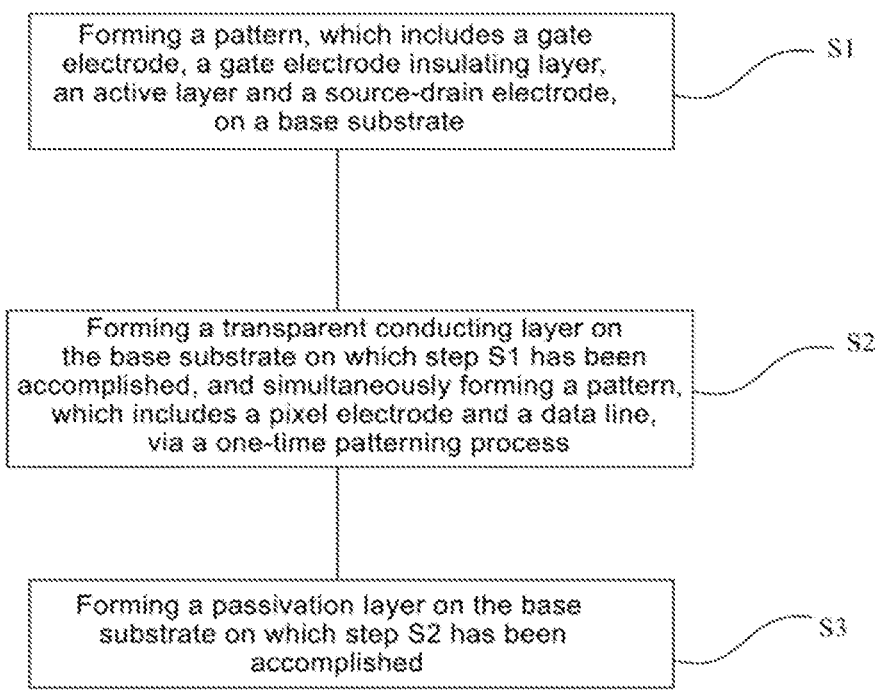
FIG. 4 is a schematic diagram showing the steps of a method for preparing an array substrate according to the invention.

As shown in FIG. 4, the invention provides a method for preparing an array substrate, which includes the following steps S1-S3.

Step S1: forming a pattern, which includes a gate electrode, a gate electrode insulating layer, an active layer and a source-drain electrode, on a base substrate;

Specifically, during the manufacturing process of the array substrate, the gate electrode, the source electrode and the drain electrode are formed of a conducting material such as a metal, and the active layer is formed of amorphous silicon (a-Si). The gate electrode insulating layer is formed of a transparent amorphous oxide such as $SiO_2$ and $SiN_x$; and the gate electrode, the gate electrode insulating layer, the active layer, the source electrode and the drain electrode are respectively formed via a patterning process.

Moreover, in step S1, a gate electrode is formed on the base substrate, and a gate line and a gate line connecting wire are further formed simultaneously.

Step S2: forming a transparent conducting layer on the base substrate on which step S1 has been accomplished, and simultaneously forming a pattern, which includes a pixel electrode and a data line, via a one-time patterning process.

According to another embodiment of the present invention, the transparent conducting layer may be formed of a material such as nanosilver or graphene, and has a low resistance value and a high light transmission rate.

Moreover, the step S2 specifically includes: forming a pattern, which includes a pixel electrode and a data line, on the base substrate on which step S1 has been accomplished, and simultaneously forming a pattern of a protection layer for protecting the gate line connecting wire.

Step S3: forming a passivation layer on the base substrate on which step S2 has been accomplished, wherein the passivation layer may be formed of an oxide of silicon, a nitride of silicon or an oxynitride.

In the method for preparing an array substrate according to this embodiment, a pixel electrode and a data line are formed simultaneously via a one-time patterning process, thus the steps of the manufacture process can be reduced, the production cost can be saved, and the production efficiency can be improved.

Embodiment 1

This embodiment provides a method for preparing an array substrate, which specifically includes the following steps S1-S3.

Figure 1:
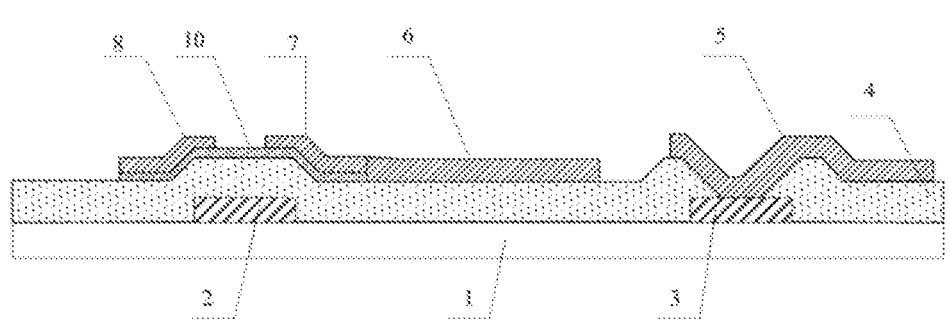
FIG. 1 is schematic diagram showing the sectional structure of an array substrate according to Embodiment 1 and Embodiment 2 of the invention.

Step S1: As shown in FIG. 1, a pattern, which includes a gate electrode 2, a gate electrode insulating layer 4, an active layer 10, a source electrode 8 and a drain electrode 7, is formed on a base substrate 1.

Figure 3:
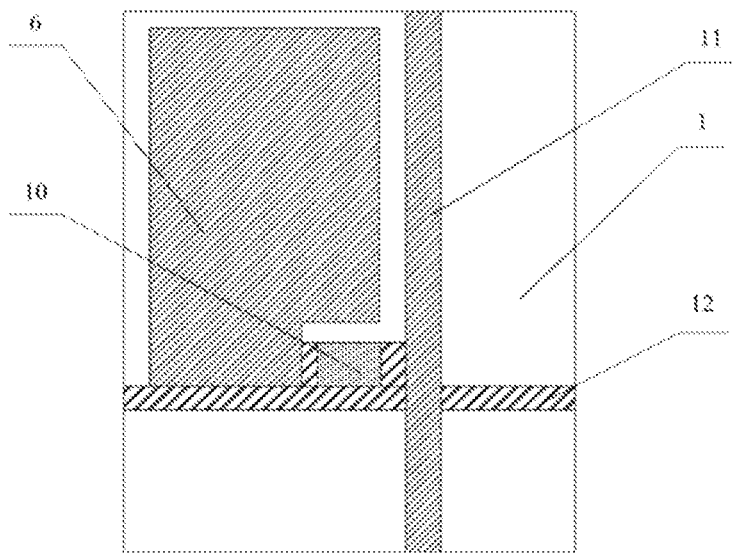
FIG. 3 is a schematic diagram showing the planar structure of the array substrate according to Embodiment 1 and Embodiment 2 of the invention.

Moreover, in step S1, at the same time the gate electrode 2 is formed, a gate line 12 as shown in FIG. 3 and a gate line connecting wire 3 as shown in FIG. 1 may be further formed.

Specifically, during the manufacturing process of the array substrate, the gate electrode, the source electrode and the drain electrode are formed of a conducting material such as a metal, and the active layer is formed of amorphous silicon (a-Si). The gate electrode insulating layer is formed of a transparent amorphous oxide such as $SiO_2$ and $SiN_x$; and the gate line, the gate line connecting wire, the gate electrode, the gate electrode insulating layer, the active layer, the source electrode and the drain electrode are respectively formed via a patterning process.

Step S2: A transparent conducting layer and a planarization layer 9 are in turn formed on the base substrate 1 on which step S1 has been accomplished, and a pattern, which includes the pixel electrode 6 and the data line 11 as shown in FIG. 3, is formed simultaneously via a one-time patterning process, or a pattern, which includes the pixel electrode 6, the data line 11 as shown in FIG. 3 and a protection layer 5 for protecting the gate line connecting wire 3, is formed simultaneously.

Specifically, a transparent conducting layer of a nanosilver material may be deposited via plasma-enhanced chemical vapor deposition (PEVCD), and then a planarization layer 9 may be deposited.

When a nanosilver material is employed to deposit a transparent conducting layer, because the surface of the transparent conducting layer formed of nanosilver is accidented, an organic resin is needed to function as a top planarization layer. A patterning process is performed on the planarization layer according to the pattern of the transparent electrode. During the patterning process, the transparent conducting layer formed of a nanosilver material may be etched via wet etching; however, the concentration of the nitric acid in the etching solution is high, and it has a strong corrosivity on the normal photosensitive organic resin. In this embodiment, a planarization layer is formed by coating an organic resin material, and a photosensitive resin material, for example, benzocyclobutene, etc., may be employed as the organic resin material. However, in this embodiment, a non-photosensitive resin material, for example, a silicon dioxide-based organic resin or a Si—C based organic resin, may be preferably employed, which can resist the corrosivity of a high-concentration nitric acid.

In an embodiment of the present invention, the step S2 specifically includes the steps of:

forming a transparent conducting layer and a planarization layer 9 in turn on the base substrate 1 on which step S1 has been accomplished;

forming a photoresist layer on the planarization layer 9, exposing and developing the photoresist layer to form a photoresist reserved region and a photoresist removed region, wherein the photoresist reserved region corresponds to the pattern of the data line and the pixel electrode to be formed (or, the photoresist reserved region corresponds to a pattern of the data line, the pixel electrode and the protection layer 5 for protecting the gate line connecting wire 3 that are to be formed), and the rest is the photoresist removed region; dry etching the planarization layer 9 corresponding to the photoresist removed region to form a pattern corresponding to the pattern of the pixel electrode 6 and the data line 11 to be formed (or, to form a pattern corresponding to the pattern of the data line, the pixel electrode and the protection layer 5 for protecting the gate line connecting wire 3 that are to be formed, which corresponds to the photoresist reserved region), as shown in FIG. 3; and wet etching the transparent conducting layer under the etched planarization layer 9 corresponding to the photoresist removed region to form a pattern that includes a data line 11 and a pixel electrode 6, and then removing the photoresist on the photoresist reserved region.

Figure 2:
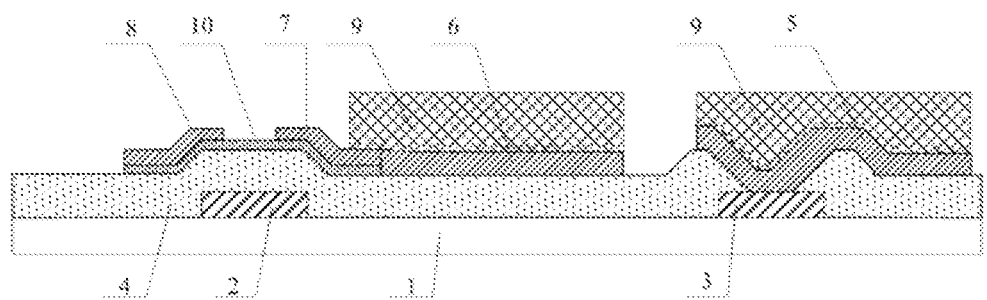
FIG. 2 is schematic diagram showing another sectional structure of the array substrate according to Embodiment 1 of the invention.

In an embodiment of the present invention, the step S2 may specifically include: forming a transparent conducting layer and a planarization layer 9 in turn on the base substrate 1 on which step S1 has been accomplished, and simultaneously forming a pattern, which includes a pixel electrode 6 and a data line 11, via a one-time patterning process (or, simultaneously forming a pattern, which includes a data line, a pixel electrode and a protection layer 5 for protecting the gate line connecting wire 3, via a one-time patterning process), as shown in FIG. 1 and FIG. 2.

Step S3: forming a passivation layer on the base substrate 1 on which step S2 has been accomplished. Wherein, a passivation layer is deposited on the base substrate 1, on which step S2 has been accomplished, via PECVD. The passivation layer may be formed of an oxide of silicon, a nitride of silicon or an oxynitride. The reacting gas corresponding to a oxide of silicon may be $SiH_4$ or $SiH_2Cl_2$; the reacting gas corresponding to a nitride of silicon may be $NH_3$, $N_2$ or $N_2O$; the passivation layer may also employ $Al_2O_3$ or a double-layer barrier structure.

This embodiment further provides an array substrate, which is manufactured by the above method for preparing an array substrate, the array substrate comprises a base substrate, and a gate electrode, a gate electrode insulating layer, an active layer, a source-drain electrode, a pixel electrode and a data line are provided on the base substrate, wherein the pixel electrode and the data line are both formed of a nanosilver material.

In an embodiment of the present invention, a planarization layer is formed on the pixel electrode and the data line. Moreover, the material of the planarization layer is a non-photosensitive resin material, for example, a silicon dioxide-based organic resin or a Si—C based organic resin.

The array substrate further includes a gate line connecting wire on the same layer as the gate electrode. Moreover, a protection layer is provided on the gate line connecting wire, and the protection layer is formed of a nanosilver material.

In the array substrate according to the invention, a silver nanowire material is employed to manufacture a transparent conducting layer and to form a pixel electrode and a data line, so that the pixel electrode and the data line both have a low resistance value and a high light transmission rate.

This embodiment further provides a display device including the above array substrate, which may be any product or component that has a display function, for example, liquid crystal panel, electronic paper, organic light-emitting diode (OLED) panel, liquid crystal TV set, liquid crystal display, digital photo frame, mobile phone and tablet computer, etc.

Embodiment 2

This embodiment provides a method for preparing an array substrate, which includes the following steps S1-S3.

Step S1: forming a gate electrode 2, a gate line connecting wire 3, a gate electrode insulating layer 4, an active layer 10, a source electrode 8 and a drain electrode 7 on a base substrate 1, as shown in FIG. 1.

Moreover, in step S1, at the same time the gate electrode 2 is formed, a gate line 12 as shown in FIG. 3 and a gate line connecting wire 3 as shown in FIG. 1 may be further formed.

Step S2: continuously depositing a transparent conducting layer of a graphene material via sputtering on the base substrate 1 on which step S1 has been accomplished; and simultaneously forming a pattern, which includes a pixel electrode 6 and a data line 11, via a one-time patterning process (or, simultaneously forming a pattern, which includes a data line, a pixel electrode and a protection layer 5 for protecting the gate line connecting wire 3, via a one-time patterning process).

The step S2 specifically includes:

forming a transparent conducting layer on the base substrate 1 on which step S1 has been accomplished; when the material of the transparent conducting layer coated is graphene, because graphene has a monolayer atom structure, the thickness thereof is very small and the planarization thereof is good, thereby no planarization layer needs to be formed on its top surface; and forming a photoresist layer on the transparent conducting layer, exposing and developing the photoresist layer to form a photoresist reserved region and a photoresist removed region, wherein the photoresist reserved region corresponds to the pattern of the data line and the pixel electrode to be formed (or, the photoresist reserved region corresponds to a pattern of the data line, the pixel electrode and the protection layer 5 for protecting the gate line connecting wire 3 that are to be formed), and the rest is the photoresist removed region; dry etching the transparent electrode layer corresponding to the photoresist removed region to form a pattern that includes a pixel electrode 6 and a data line 11 as shown in FIG. 3 (or, a pattern that includes a data line, a pixel electrode 6 and a protection layer 5 for protecting the gate line connecting wire 3), and then removing the photoresist on the photoresist reserved region, as shown in FIG. 1 and FIG. 3.

In this embodiment, when a dry etching is used to etch the transparent electrode layer corresponding to the photoresist removed region, it needs to avoid the corrosion on the gate electrode insulating layer and the active layer on the bottom layer. Therefore, it usually employs one of $CF_6$ and $CF_4$ or a mixture thereof as the etching gas, rather than employs $O_2$, $Cl_2$, etc., that are used in a normal etching process. The carbon structure of graphene is etched via the physical bombardment of $SF_6$ or $CF_4$; and at the same time, because the etching gas does not contain $O_2$ and $Cl_2$, it has a good selection ratio for the gate electrode insulating layer and the active layer on the bottom layer, thus the gate electrode insulating layer on the bottom layer may be effectively protected.

Step S3: forming a passivation layer on the base substrate 1 on which step S2 has been accomplished. A passivation layer is formed via PECVD on the base substrate 1 on which step S3 has been accomplished. The passivation layer may be formed of an oxide of silicon, a nitride of silicon or an oxynitride, and the reacting gas corresponding to an oxide of silicon may be $SiH_4$ and $SiH_2Cl_2$; the reacting gas corresponding to a nitride of silicon may be $NH_3$, $N_2$ or $N_2O$.

This embodiment further provides an array substrate, which is manufactured by the above method for preparing an array substrate, the array substrate comprises a base substrate, and a gate electrode, a gate electrode insulating layer, an active layer, a source-drain electrode, a pixel electrode and a data line are provided on the base substrate, wherein the pixel electrode and the data line are both formed of a graphene material.

The array substrate further includes a gate line connecting wire on the same layer as the gate electrode. Moreover, a protection layer is provided on the gate line connecting wire, and the protection layer is formed of a graphene material.

In the array substrate according to the invention, a graphene material is employed to manufacture a transparent conducting layer and to form a pixel electrode and a data line, so that the pixel electrode and the data line both have a low resistance value and a high light transmission rate.

This embodiment further provides a display device including the above array substrate, which may be any product or component that has a display function, for example, liquid crystal panel, electronic paper, organic light-emitting diode (OLED) panel, liquid crystal TV set, liquid crystal display, digital photo frame, mobile phone and tablet computer, etc.

In the invention, the patterning process may only include a photoetching process, or the patterning process may include a photoetching process and an etching step; and at the same time, it may also include other processes for forming a predetermined pattern, for example, printing and ink-injecting, etc. The photoetching process refers to a process in which a pattern is formed by using a photoresist, a mask plate and an exposing machine, etc., and it includes process flows such as film forming, exposing and developing, etc. A corresponding patterning process may be selected according to the structure formed in the invention.

The above embodiments are only used for illustrating the invention, rather than limiting the scope of the invention. Various variations and modifications may be made by one of ordinary skills in the art without departing from the spirit and scope of the invention. Therefore, all the equivalent technical solutions pertain to the scope of the invention, and the protection scope of the invention should be defined by the appended claims.

What is claimed is:

1. A method for preparing an array substrate, wherein the array substrate comprises: a base substrate; a gate electrode and a gate line connecting wire on the substrate, wherein the gate electrode and the gate line connecting wire are coplanar; a gate electrode insulating layer on the gate electrode, the gate line connecting wire and the base substrate; an active layer, a pixel electrode and a protection layer on the gate electrode insulating layer; a source electrode and a drain electrode on the active layer; and a planarization layer; wherein the gate electrode insulating layer has a groove at a position corresponding to the gate line connecting wire, and the protection layer is in the groove and extends on to a plane surface of the gate electrode insulating layer adjacent to the groove; an area of a projection of the protection layer onto the base substrate is larger than an area of a projection of the gate line connecting wire onto the base substrate; the active layer and the drain electrode are connected to the pixel electrode, and a thickness of the pixel electrode is equal to a sum of a thickness of the active layer and a thickness of the drain electrode; and the planarization layer is on the protection layer, the pixel electrode and the drain electrode; the method comprising:

Step S1: forming a pattern, which includes the gate electrode, the gate electrode insulating layer, the active layer and the source electrode and the drain electrode, on the base substrate; and Step S2: forming a transparent conducting layer on the base substrate on which step S1 has been accomplished, and simultaneously forming a pattern, which includes the pixel electrode and a data line, via a one-time patterning process.

2. The method according to claim 1, wherein, in the step S1, the step of forming the gate electrode on the base substrate further comprises forming a pattern of a gate line and the gate line connecting wire.

3. The method according to claim 1, wherein the method further comprising:

Step S3: forming a passivation layer on the base substrate on which step S2 has been accomplished.

4. The method according to claim 1, wherein, in the step S2, the transparent conducting layer is formed of a nanosilver material.

5. The method according to claim 4, wherein, the step S2 comprises:

forming the transparent conducting layer and the planarization layer in turn on the base substrate on which step S1 has been accomplished, and simultaneously forming the pattern, which includes the pixel electrode and the data line, via the one-time patterning process.

6. The method according to claim 5, wherein, the step S2 comprises:

forming the transparent conducting layer and the planarization layer in turn on the base substrate on which step S1 has been accomplished;

forming a photoresist layer on the planarization layer, exposing and developing the photoresist layer to form a photoresist reserved region and a photoresist removed region, wherein the photoresist reserved region corresponds to the pattern of the data line and the pixel electrode to be formed, and the rest is the photoresist removed region; and dry etching the planarization layer corresponding to the photoresist removed region to form a pattern corresponding to the pattern of the pixel electrode and the data line to be formed; and wet etching the transparent conducting layer under the etched planarization layer corresponding to the photoresist removed region to form the pattern that includes the data line and the pixel electrode, and then removing the photoresist layer on the photoresist reserved region.

7. The method according to claim 6, wherein, in the step S2, the pattern, which includes the pixel electrode and the data line, is formed on the base substrate on which step S1 has been accomplished, and a pattern of the protection layer for protecting the gate line connecting wire is also formed simultaneously.

8. The method according to claim 5, wherein, in the step S2, the pattern, which includes the pixel electrode and the data line, is formed on the base substrate on which step S1 has been accomplished, and a pattern of the protection layer for protecting the gate line connecting wire is also formed simultaneously.

9. The method according to claim 1, wherein, in the step S2, the transparent conducting layer is formed of a graphene material.

10. The method according to claim 9, wherein, the step S2 comprises:

forming the transparent conducting layer on the base substrate on which step S1 has been accomplished; and forming a photoresist layer on the transparent conducting layer, exposing and developing the photoresist layer to form a photoresist reserved region and a photoresist removed region, wherein the photoresist reserved region corresponds to the pattern of the data line and the pixel electrode to be formed, and the rest is the photoresist removed region; dry etching the transparent conducting layer corresponding to the photoresist removed region to form the pattern that includes the pixel electrode and the data line, and then removing the photoresist layer on the photoresist reserved region.

11. The method according to claim 10, wherein, etching gas used for dry etching is one of $CF_6$ and $CF_4$, or a mixture thereof.

12. The method according to claim 10, wherein, in the step S2, the pattern, which includes the pixel electrode and the data line, is formed on the base substrate on which step S1 has been accomplished, and a pattern of the protection layer for protecting the gate line connecting wire is also formed simultaneously.

13. The method according to claim 9, wherein, in the step S2, the pattern, which includes the pixel electrode and the data line, is formed on the base substrate on which step S1 has been accomplished, and a pattern of the protection layer for protecting the gate line connecting wire is also formed simultaneously.

14. An array substrate, comprising:
a base substrate;
a gate electrode and a gate line connecting wire on the substrate, wherein the gate electrode and the gate line connecting wire are coplanar;
a gate electrode insulating layer on the gate electrode, the gate line connecting wire, and the base substrate;
an active layer, a pixel electrode, and a protection layer on the gate electrode insulating layer;
a source electrode and a drain electrode on the active layer; and
a planarization layer;
wherein the gate electrode insulating layer has a groove at a position corresponding to the gate line connecting wire, and the protection layer is in the groove and extends on to a plane surface of the gate electrode insulating layer adjacent to the groove;
an area of a projection of the protection layer onto the base substrate is larger than an area of a projection of the gate line connecting wire onto the base substrate;
the active layer and the drain electrode are connected to the pixel electrode, and a thickness of the pixel electrode is equal to a sum of a thickness of the active layer and a thickness of the drain electrode; and
the planarization layer is on the protection layer, the pixel electrode, and the drain electrode.

* * * * *